United States Patent [19]

Jones

[11] Patent Number: 4,727,315
[45] Date of Patent: Feb. 23, 1988

[54] ELECTRICITY METERING EQUIPMENT

[75] Inventor: Alan J. Jones, Staffordshire, England

[73] Assignee: The General Electric Company, p.l.c., England

[21] Appl. No.: 731,534

[22] Filed: May 7, 1985

[30] Foreign Application Priority Data

May 14, 1984 [GB] United Kingdom ............... 8412277

[51] Int. Cl.⁴ .............................................. G01R 1/00
[52] U.S. Cl. .................................. 324/110; 324/126; 324/127; 340/825.17
[58] Field of Search ................ 324/110, 126, 127; 307/35; 194/11; 340/825.17; 320/2

[56] References Cited

U.S. PATENT DOCUMENTS

| | | | |
|---|---|---|---|
| 873,356 | 12/1907 | Dowling | 194/11 |
| 4,240,030 | 12/1980 | Bateman et al. | 324/110 |
| 4,301,444 | 11/1981 | Bruckert et al. | 340/825.06 X |
| 4,383,210 | 5/1983 | Wilkinson | 320/2 X |
| 4,390,876 | 6/1983 | Bjorklund et al. | 340/825.17 |
| 4,532,971 | 7/1985 | Hurley | 324/110 |

FOREIGN PATENT DOCUMENTS

| | | |
|---|---|---|
| 0014517 | 8/1980 | European Pat. Off. |
| 0034031 | 8/1981 | European Pat. Off. |
| 0085769 | 8/1983 | European Pat. Off. |
| 0084634 | 8/1983 | European Pat. Off. |
| 2488998 | 8/1981 | France |
| 208365 | 12/1923 | United Kingdom |
| 357221 | 9/1931 | United Kingdom |
| 691299 | 5/1953 | United Kingdom |
| 2061641 | 5/1981 | United Kingdom |

Primary Examiner—Reinhard J. Eisenzopf
Assistant Examiner—Vinh P. Nguyen
Attorney, Agent, or Firm—Kirschstein, Kirschstein, Ottinger & Israel

[57] ABSTRACT

An electricity metering equipment wherein, in order to reduce the possibility of fraudulent consumption of electricity, there is provided in addition to the usual meter (3) for measuring the amount of electricity consumed in a load, an independent device (5) which produces a signal representative of the current supplied to the load. A comparison device (4) then compares the signal with the rate of electricity consumption measured by the meter, and an output signal is produced if there is a discrepancy which may be used to disconnect the supply and/or transmit a signal to the supply authority.

6 Claims, 2 Drawing Figures

ELECTRICITY METERING EQUIPMENT

BACKGROUND OF THE INVENTION

1. Field of the Invention

This invention relates to electricity metering equipment of the kind which measures the amount of electricity consumed in a load and is suitable for installation in a consumer's premises by a supply authority for tariff purposes.

2. Description of Related Art

It is well known that such equipment is susceptible to fraud by interference with either the equipment itself or with its associated wiring. It is an object of the invention to provide such an equipment whose susceptibility to fraud is reduced.

SUMMARY OF THE INVENTION

Accordingly, the invention provides an electricity metering equipment comprising: electricity metering means for measuring the amount of electricity consumed in a load; means independent of said metering means for deriving a first signal in response to the supply of electricity to said load; and comparison means for producing an output signal in response to a predetermined discrepancy between said first signal and a comparable second signal derived from said metering means.

In a preferred embodiment of the invention said first signal is a signal representative of the current supplied to said load and said second signal is a signal representative of the rate of consumption of electricity by said load.

An equipment in accordance with the invention normally further includes means for performing an action in response to said output signal. Accordingly, an equipment in accordance with the invention will normally further include switch means for disconnecting the load from the electricity supply and/or transmitting a further signal to a remote location, for example the supply authority, in response to said output signal.

In one particular embodiment of the invention the equipment further includes a prepayment unit arranged to connect the supply to the load on the insertion of coins or tokens into the unit and to disconnect the supply from the load when the metering means has indicated the consumption of an amount of electricity corresponding to the tokens or coins inserted. Preferably the prepayment unit is arranged to operate said switch means to disconnect said supply from the load.

BRIEF DESCRIPTION OF THE DRAWINGS

One electricity metering equipment in accordance with the invention will now be described, by way of example, with reference to the accompanying drawings in which.

DETAILED DESCRIPTION OF THE PREFERRED EMBODIMENT

Figure 1:
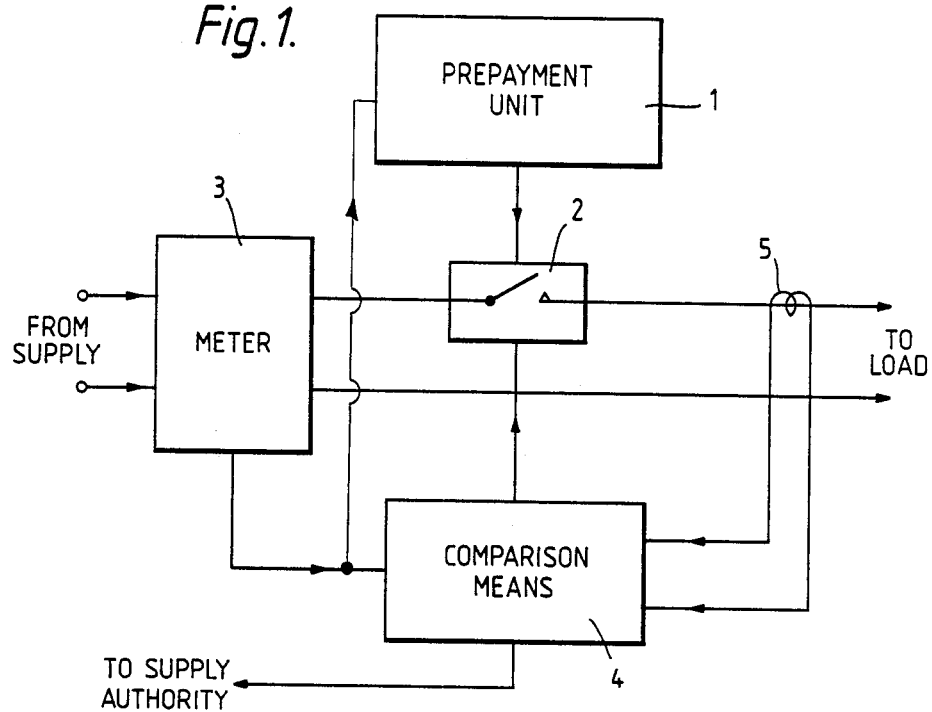
FIG. 1 is a schematic diagram of the equipment.

Referring to FIG. 1 of the drawings, the equipment includes a prepayment unit 1 which accepts coins or tokens from a consumer and closes, or allows a consumer to close, a switch 2 in the supply to the consumers load in response to coins or tokens being fed into the unit. The switch 2 may conveniently be incorporated in the prepayment unit 1 but may alternatively be separate from the unit 1. An electricity meter 3 produces electrical impulses each of which represents the consumption of a given amount of electricity which impulses are received by the prepayment unit. Upon receipt of the number of impulses which correspond to the amount of electricity that has been paid for, the prepayment unit opens the switch and thus disconnects the supply from the load until further coins etc. are inserted into the unit.

In accordance with the invention the electrical impulses produced by the meter 3 are also passed to a comparison means 4. This comparison means 4 also receives a signal from a current transformer 5 representing the current supplied to the load. The value of this current is compared by the comparison means 4 with the rate of receipt of impulses from the electricity meter 3. If there is a predetermined discrepancy, the output signal of the comparison means is utilised to open the switch 2 and so disconnect the load from the supply. Additionally or alternatively, a signal may be transmitted to the supply authority.

It will be appreciated that the consumption as indicated by the electrical impulses is in terms of watthours while the consumption as indicated by the current from the transformer 5 is in terms of ampere-hours so that their comparison requires assumptions regarding the supply voltage and the load power factor. In fact, this is not important as the type of fradulent interference the equipment is required to detect will normally cause a large relative discrepancy between the two indications, therefore the equipment can be set so that it does not respond to the smaller discrepancies caused by these assumptions without impairing its effectiveness to detect fraudulent interference with the metering equipment.

It will be appreciated that the meter may be of any kind providing output impulses representative of electricity consumption but is suitably of the eddy current disc type incorporating means producing impulses in accordance with rotation of the disc.

Figure 2:
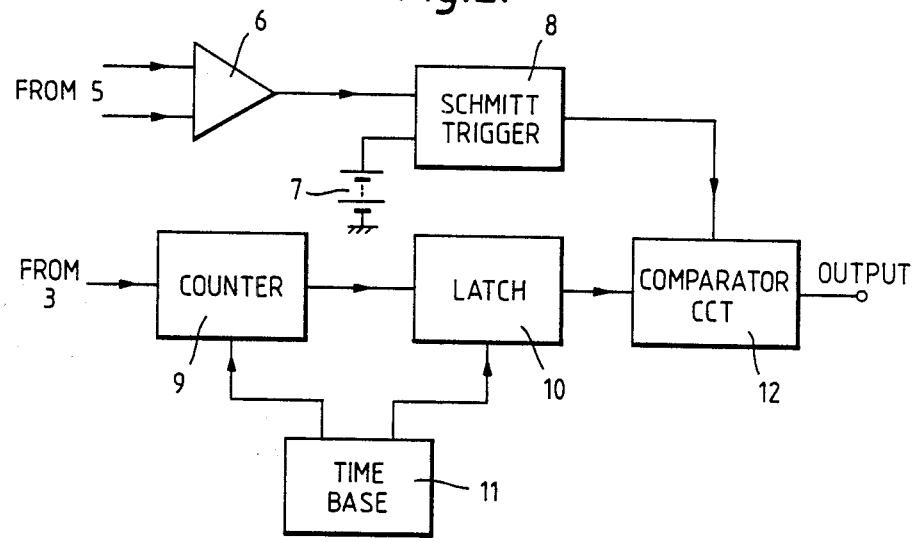
FIG. 2 is a schematic diagram of a preferred form of part of the equipment.

Referring now to FIG. 2, in one particular equipment of the form shown in FIG. 2, the comparison means 4 includes a circuit 6 incorporating amplifying means which in response to the output of the current transformer 5 produces a unidirectional voltage representative of the value of the current supplied to the load. The output of the circuit 6 is compared with the voltage of a reference source by a Schmitt trigger circuit 8 which produces an output when the current supplied to the load exceeds a predetermined level defined by the reference source 7, e.g. 0.5A.

The comparison means 4 further includes a counter 9 and associated latch 10 controlled by a time base 11. Under control of the time base 11 the counter 9 counts the impulses received from the meter 3 during a period T. At the end of each period T the count of the counter is latched into 10 and the counter 9 reset.

The comparison means 4 further includes a comparator circuit 12 which is arranged to be activated only when the Schmitt trigger circuit 8 produces an output. In the comparison circuit 12 the count in latch 10 is compared with a predetermined stored count, the circuit 12 producing a signal at the output of the comparison means 4 only if the latched count is less than the stored count.

The stored count has a value which, within the limits discussed above, corresponds to the value of load current defined by the reference source 7. Hence if the current supplied to the load exceeds this value and pulses are being produced by the meter 3 at a rate lower than should be the case for this value of current, the load will be disconnected from the supply and/or a signal transmitted to the supply authority.

It will be understood that if desired the equipment may be modified to compare the value of the current supplied to the load and the rate of receipt of impulses from the meter 3 for two or more predetermined current values or even continuously over a range of current values. However, this of course increases the cost of the equipment and in general comparison at a single predetermined current level is formed to give satisfactory protection against fraud.

I claim:

1. An electricity metering equipment, comprising:
   (A) electricity metering means for measuring an amount of electricity consumed in a load connected to an electricity supply via said metering means, said metering means producing impulses each of which represents consumption of a given amount of electricity;
   (B) means independent of said metering means for producing a first signal representative of a current supplied to said load;
   (C) means for deriving from said metering means per se a second signal representative of a rate of consumption of electricity in said load as measured by said metering means per se; and
   (D) comparison means, responsive to said first and second signals to produce an output signal in response to a predetermined discrepancy between said first and second signals, said comparison means including means for producing an output signal when the rate of consumption of electricity as represented by said second signal is below a rate corresponding to a predetermined value of the current supplied to the load as represented by said first signal, and the value of the current supplied to the load as represented by said first signal is not less than said predetermined value, said means for producing an output signal including
      (i) a counter means for providing a count of impulses produced by said metering means in a predetermined period,
      (ii) a comparator for comparing the count of the counter means for each said predetermined period with a predetermined count corresponding to said predetermined value of the current supplied to the load, and
      (iii) means for inhibiting the comparator when the value of the current supplied to the load is less than said predetermined value.

2. An equipment according to claim 1 wherein said means independent of said metering means comprises a current transformer.

3. An equipment according to claim 1 including switch means for disconnecting the load from the electricity supply in response to said output signal.

4. An equipment according to claim 1 wherein said comparison means is also operative for transmitting a warning signal to a remote location in response to a said discrepancy.

5. An equipment according to claim 1 further including a switch means connected between said load and said supply; and a prepayment unit connected with said switch means and said metering means and responsive to the insertion of coins or tokens into the prepayment unit to close said switch means, thereby to connect said load to said supply, and responsive to an indication by said metering means of the consumption of an amount of electricity corresponding to the coins or tokens inserted to open said switch means, thereby to disconnect said load from said supply.

6. An equipment according to claim 5 including a connection between said comparison means and said switch means and whereby said switch means is opened in response to the production of a said output signal by said comparison means.

* * * * *